(12) United States Patent
Arnz et al.

(10) Patent No.: US 8,731,273 B2
(45) Date of Patent: May 20, 2014

(54) METHOD AND DEVICE FOR MEASURING THE RELATIVE LOCAL POSITION ERROR OF ONE OF THE SECTIONS OF AN OBJECT THAT IS EXPOSED SECTION BY SECTION

(75) Inventors: Michael Arnz, Oberkochen (DE); Dirk Beyer, Weimar (DE); Wolfgang Harnisch, Lehesten (DE); Thomas Scheruebl, Jena (DE)

(73) Assignee: Carl Zeiss SMS GmbH, Jena (DE)

( * ) Notice: Subject to any disclaimer, the term of this patent is extended or adjusted under 35 U.S.C. 154(b) by 298 days.

(21) Appl. No.: 13/130,600

(22) PCT Filed: Nov. 28, 2009

(86) PCT No.: PCT/EP2009/008483
§ 371 (c)(1), (2), (4) Date: May 23, 2011

(87) PCT Pub. No.: WO2010/063418
PCT Pub. Date: Jun. 10, 2010

(65) Prior Publication Data
US 2011/0229010 A1    Sep. 22, 2011

Related U.S. Application Data

(60) Provisional application No. 61/119,408, filed on Dec. 3, 2008.

(51) Int. Cl.
*G06K 9/40* (2006.01)
*G01N 21/00* (2006.01)

(52) U.S. Cl.
USPC .......................... 382/144; 382/260; 356/237.5

(58) Field of Classification Search
CPC .................................................. G03F 7/70633
USPC ............... 382/144, 151, 152, 260; 356/237.5, 356/399–401, 468, 474.02, 488–491, 559; 250/305, 491.1, 397, 398; 364/491, 364/559, 468; 430/394, 326, 311, 30, 935; 378/34, 35; 355/43, 53; 700/121
See application file for complete search history.

(56) References Cited

U.S. PATENT DOCUMENTS 5,124,927 A  *  6/1992  Hopewell et al. ............. 700/121
(Continued)

FOREIGN PATENT DOCUMENTS

WO    WO2008/129421    10/2008

OTHER PUBLICATIONS

Klose et al, "PROVE(TM) a photomask registration and overlay metrology system for the 45 nm node and beyond", *Proceedings of the SPIE—The International Society for the Optical Engineering*, SPIE, US, vol. 7028, 702832, Apr. 16, 2008, pp. 702832-1-702832-6.

(Continued)

*Primary Examiner* — Sheela Chawan
(74) *Attorney, Agent, or Firm* — Fish & Richardson P.C.

(57) ABSTRACT

A method for measuring the relative local position error of one of the sections of an object that is exposed section by section, in particular of a lithography mask or of a wafer, is provided, each exposed section having a plurality of measurement marks, wherein a) a region of the object which is larger than the one section is imaged in magnified fashion and is detected as an image, b) position errors of the measurement marks contained in the detected image are determined on the basis of the detected image, c) corrected position errors are derived by position error components which are caused by the magnified imaging and detection being extracted from the determined position errors of the measurement marks, d) the relative local position error of the one section is derived on the basis of the corrected position errors of the measurement marks.

26 Claims, 5 Drawing Sheets

(56) References Cited

U.S. PATENT DOCUMENTS

| | | | |
|---|---|---|---|
| 7,408,643 B2* | 8/2008 | Kimba et al. | 356/401 |
| 2005/0105092 A1* | 5/2005 | Ausschnitt et al. | 356/401 |
| 2006/0158643 A1 | 7/2006 | Yoshida | |

OTHER PUBLICATIONS

International Search report for PCT/EP2009/008483.
International Preliminary Report on Patentability for International Application No. PCT/EP2009/008483 dated Jun. 16, 2011 (4 pages).

* cited by examiner

METHOD AND DEVICE FOR MEASURING THE RELATIVE LOCAL POSITION ERROR OF ONE OF THE SECTIONS OF AN OBJECT THAT IS EXPOSED SECTION BY SECTION

CROSS REFERENCE TO RELATED APPLICATIONS

This application is the National Stage of International Application No. PCT/EP2009/008483, filed Nov. 28, 2009, which claims priority to German Application No. 10 2008 060 293.0, filed on Dec. 3, 2008 and to U.S. Provisional Patent Application Ser. No. 61/119,408, filed on Dec. 3, 2008. The contents of the above applications are incorporated by reference in their entireties.

The present invention relates to a method and a device for measuring the relative local position error of one of the sections of an object that is exposed section by section, in particular of a lithography mask or of a wafer.

Such objects are exposed section by section by a writer, where the writer can be an electron beam or laser beam writer, for example. The writer has a writing field having a size of 10×10 µm, for example, in which it exposes the desired structures highly accurately using the electron beam or laser beam. In order to expose larger regions, after the exposure of the section lying in the writing field, the object is displaced in such a way that the section meant to be exposed directly adjoins the section that has already been exposed. The displacement of the object can be erroneous, however, such that the section to be exposed is offset relative to the section that has already been exposed. This offset is often called a stitching error or relative local position error.

These local position errors are very small (typically in the range of a few nm) and can hardly be determined without intrafield distortion calibration of existing registration measuring apparatuses. However, such a distortion calibration is very complicated and leads to high apparatus costs.

The problem addressed by the invention, therefore, is to provide a method and a device for measuring the relative local position error of one of the sections of an object that is exposed section by section, in particular of a lithography mask or of a semiconductor wafer, with which the measurement can be carried out comparatively simply and cost-effectively.

According to the invention, the problem is solved by means of a method for measuring the relative local position error of one of the sections of an object that is exposed section by section, in particular of a lithography mask or of a wafer, each exposed section having a plurality of measurement marks, wherein a) a region of the object which is larger than the one section is imaged in magnified fashion and is detected as an image,
b) position errors of the measurement marks contained in the detected image are determined on the basis of the detected image,
c) corrected position errors are derived by position error components which are caused by the magnified imaging and detection being extracted from the determined position errors of the measurement marks,
d) the relative local position error of the one section is derived on the basis of the corrected position errors of the measurement marks.

This measuring method makes it possible to derive the relative local position error of the one section with just one recording. In particular, therefore, there is no need for highly accurate positioning of the object for the recording. Moreover, the errors caused by the recording can be extracted well, such that the relative local position error can be determined very accurately without e.g. having to carry out complicated calibrations for the magnified imaging.

In particular, in step c), a high-pass filtering can be carried out for deriving the corrected position error. The position error components caused by the magnified imaging and detection can thus be extracted very well from the position error determined. This makes use of the fact that the position errors of the measurement marks at the section boundaries change abruptly, whereas the position error components caused by the magnified imaging and detection change significantly more slowly.

In particular, in step d), the measurement marks which lie in one section can be determined on the basis of the corrected position errors of the measurement marks, and the corrected position errors of the measurement marks thus determined can be used for deriving the relative local position error of the one section. In particular, averaging can be used for this purpose.

A very accurate determination of the relative local position error is possible by means of these steps.

Furthermore, in step c), a function which changes more slowly than the expected change in the determined position errors of the measurement marks at the section boundaries can be fitted to the position errors determined and then, for each position error determined, the function value of the fitted function for the corresponding measurement mark can be subtracted in order to obtain the corrected position error. These steps can easily be implemented and lead to a highly accurate determination of the relative local position error.

In step a), a region of the object which completely contains a plurality of sections can be imaged in magnified fashion and can be detected as an image, and in step d), the relative local position errors can be derived for each of the plurality of sections.

It is thus possible to determine the relative local position error with high accuracy with just one recording for a plurality of sections.

The measurement marks can be conventional measurement marks for registration, such as e.g. crosses, angles, rectangle in rectangle, contact holes, . . . Grid structures or any other type of structures whose positions on the object are known can also be used as measurement marks. Preferably, at least three to five measurement marks in each direction (x- and y-direction) are present per section Furthermore, a device for measuring the relative local position error of one of the sections of an object that is exposed section by section, in particular of a lithography mask or of a wafer, each exposed section having a plurality of measurement marks, is provided, comprising a recording module, which images a region of the object that is larger than the one section in magnified fashion and detects it as an image, and an evaluation module, which A) determines position errors of the measurement marks contained in the detected image on the basis of the detected image,
B) derives corrected position errors by position error components which are caused by the magnified imaging and detection being extracted from the determined position errors of the measurement marks,
C) derives the relative local position error of the one section on the basis of the corrected position errors of the measurement marks.

With this device, the relative local position error can be determined with high accuracy.

In particular, in step B), the evaluation module can carry out a high-pass filtering for deriving the corrected position errors. This can easily be implemented and leads to very accurate results.

Furthermore, in step C), the evaluation module of the device can determine the measurement marks which lie in one section on the basis of the corrected position errors of the measurement marks, and can use the corrected position errors of the measurement marks thus determined for deriving the relative local position error of the one section. In particular, averaging can be carried out for this purpose. This leads to an extremely accurate determination of the relative local position error.

In the device according to the invention, in step B) the evaluation module can fit a function which changes more slowly than the expected change in the determined position errors of the measurement marks at the section boundaries to the position errors determined and then, for each position error determined, can subtract the function value of the fitted function for the corresponding measurement mark in order to obtain the corrected position error. A highly accurate determination of the relative local position error is thus made possible The recording module of the device according to the invention can image a region of the object which completely contains a plurality of sections in magnified fashion and can detect it as an image, and in step C) the evaluation module can derive the relative local position error for each of the plurality of sections. It is thus possible to determine a plurality of local position errors of a plurality of sections simultaneously with high accuracy with just one recording.

Of course, in the method according to the invention and the device according to the invention it is possible to carry out a plurality of recordings of the same region and to determine the relative local position error(s) for each of the recordings and to obtain the relative local position(s) with higher accuracy on the basis of the local position errors thus determined (for example by means of averaging). It is also possible for a plurality of different regions to be recorded and evaluated in the manner according to the invention in order to determine the relative local position error(s) in the different regions.

If adjoining regions are recorded, the individual regions overlapping, then the different regions evaluated can be combined to form a more comprehensive region. The relative position errors of the more comprehensive region can then be represented visually, by way of example.

The local position error(s) determined can be used e.g. in order to improve the writer used with regard to the accuracy in the positioning of the object, in order to minimize the relative local position errors of the sections in objects to be exposed.

It goes without saying that the features mentioned above and those yet to be explained below can be used not only in the combinations specified, but also in other combinations or by themselves, without departing from the scope of the present invention.

The invention is explained in even greater detail below by way of example with reference to the accompanying drawings, which also disclose features essential to the invention and in which.

Figure 3:
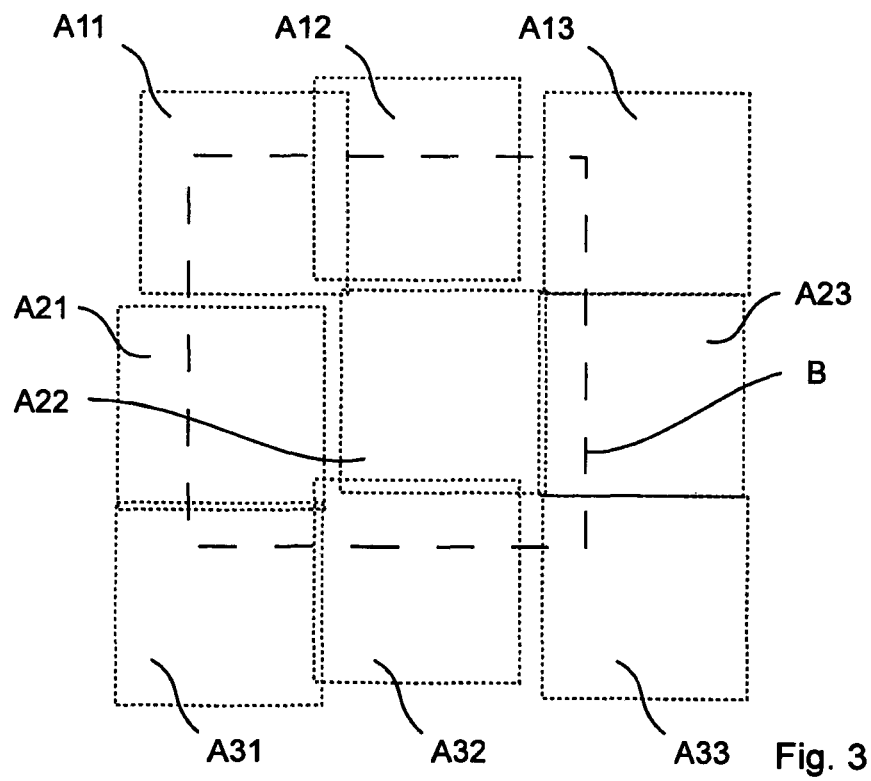
Figure 4:
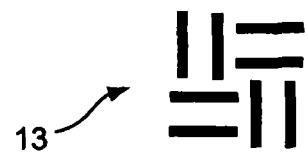
Figure 5:
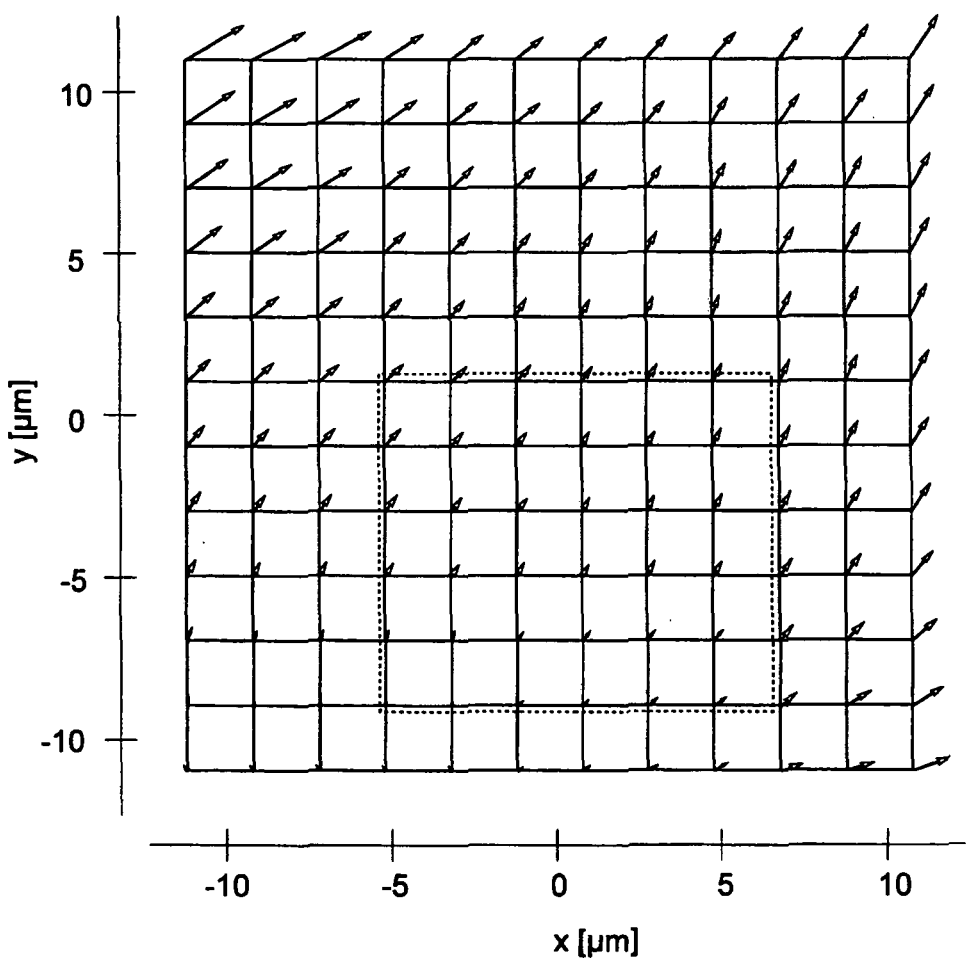
Figure 6:
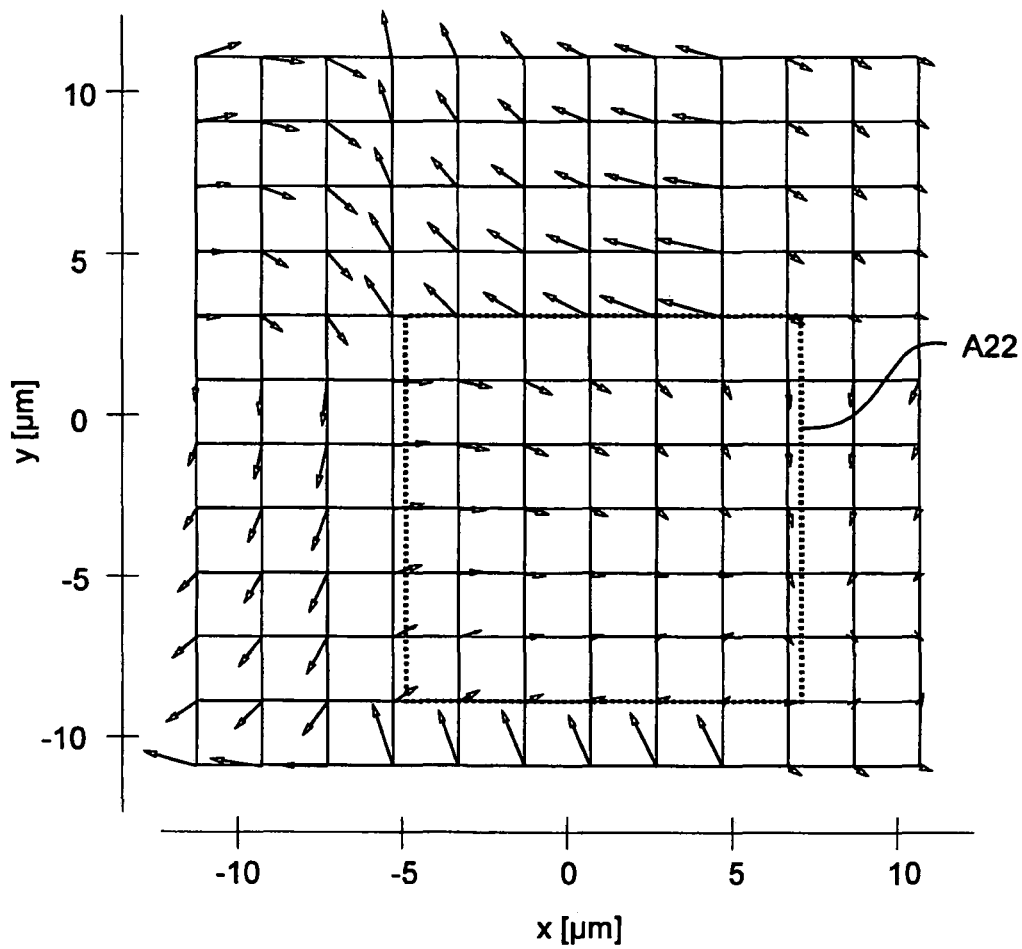
Figure 7:
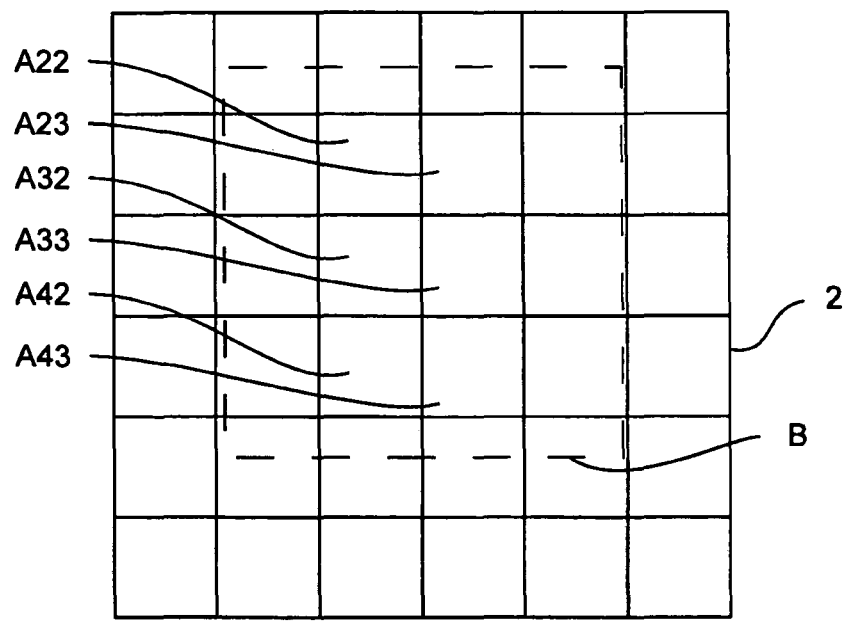

FIG. 3 a further schematic plan view of the object 2 for elucidating the relative local position error;

FIG. 4 shows an illustration of a measurement mark 13;

FIG. 5 shows the illustration of a vector field of the measured position errors of the detected measurement marks 13;

FIG. 6 shows the illustration of a vector field of the corrected position errors of the measurement marks 13;

FIG. 7 shows a schematic plan view of a further object 2, and

Figure 8:
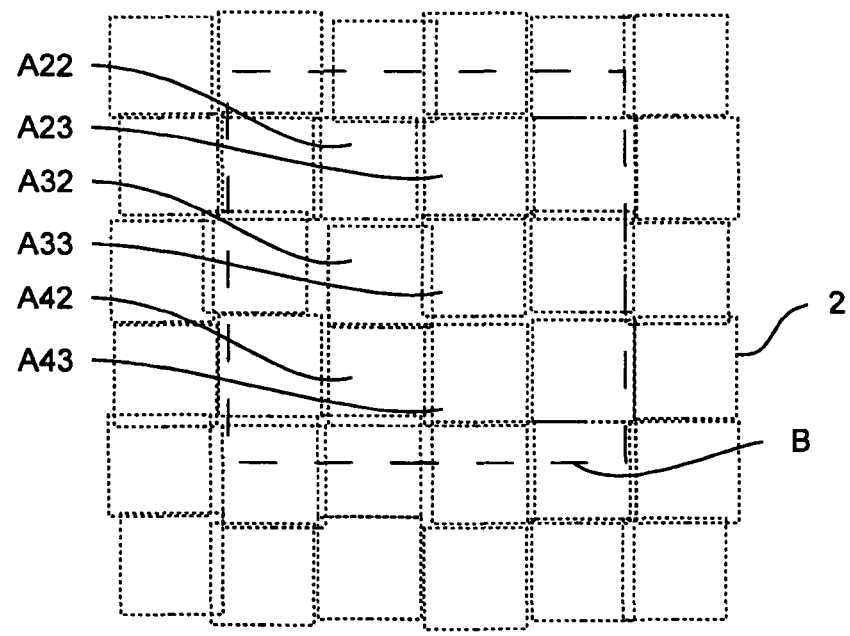

FIG. 8 shows a further schematic plan view of the object 2 from FIG. 7 for elucidating the stitching error.

Figure 1:
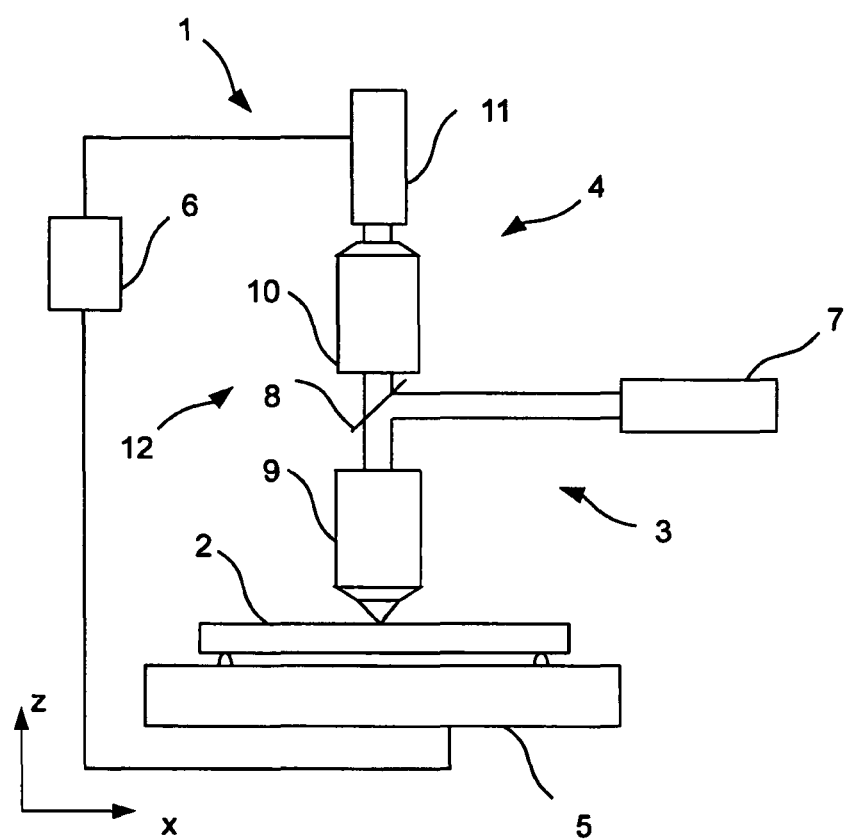
FIG. 1 shows a schematic view of the device according to the invention for measuring the relative local position error.

In the embodiment shown in FIG. 1, the device 1 for measuring the local position error of one of the sections of an object 3 that is exposed section by section, which object in this case is a lithography mask, comprises an illumination module 3, a detection module 4, an object stage 5, and a control unit 6.

The illumination module 3 comprises an illumination source 7, which emits incoherent or partial coherent illumination radiation having a wavelength of 193 nm, a partly transparent deflection mirror 8 and also an objective 9, the illumination radiation being directed via the deflection mirror 8 and the objective 9 onto a region of the object 2 that is to be imaged.

The detection module 4 comprises the objective 9, the deflection mirror 8, a tube optical unit 10 and also a CCD camera 11, the objective 9 together with the tube optical unit 10 forming a magnifying imaging optical unit 12, by means of which the illuminated region of the object 2 is imaged in magnified fashion and is recorded as an image by means of the CCD camera 11.

Figure 2:
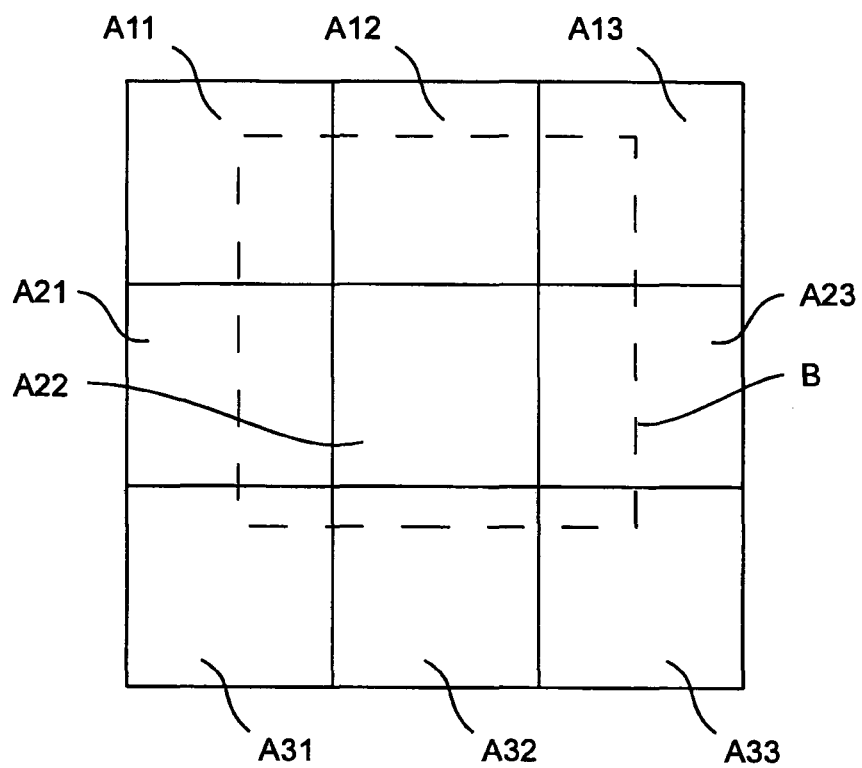
FIG. 2 shows a schematic plan view of the object 2.

As is indicated in the schematic plan view in FIG. 2, the lithography mask 2 was exposed section by section, the individual sections ideally directly adjoining one another in each case.

FIG. 2 schematically illustrates nine sections A11, A12, . . . A33 of identical size. Each of said sections A11 . . . A33 is successively exposed in a mask writer by means of an electron beam or a laser beam, for example, and, after the exposure of an individual section, the lithography mask is correspondingly moved in the mask writer in order to be able to expose the next section. Since this method is not possible in a manner absolutely free of errors, the individual sections A11 . . . A33 in the exposed lithography mask 2 are offset with respect to one another and thus respectively have a relative local position error, as is illustrated schematically in FIG. 3. In FIG. 3, the relative local position error of the individual sections A11-A33 is not depicted in a manner true to scale, but rather is illustrated in a significantly exaggerated manner. This is because the relative local position error is of the order of magnitude of a few nm, which, given an edge length of 12 μm of the individual sections A11-A33, would be indiscernible in an illustration true to scale.

In order to determine the relative local position error of one of the sections A11-A33, the device 1 records a region B of the lithography mask which is larger than the size of the individual sections A11-A33. The size of the region B is chosen, in particular, such that at least one of the sections lies completely within the region B. The region B is depicted by a dashed line in each case in FIGS. 2 and 3.

In each of the sections A11-A33, a plurality of measurement marks 13 have in each case also been concomitantly exposed in addition to the required structures for the mask 2. In order to simply the illustration, the structures and measurement marks 13 are not depicted in FIGS. 2 and 3. However, a measurement mark 13 is shown in greatly enlarged fashion in FIG. 4.

In the example described here, the size of the square region B is 20 μm×20 μm, such that in this region 12×12 measurement marks 13 arranged in a regular grid are imaged by means of the imaging optical unit 12 and recorded by the CCD camera 11.

The measurement marks 13 can be arranged in the form of a regular grid, a distance between two adjacent measurement marks 13 in x- and y-direction down to the resolution limit of the imaging optical unit 12 being possible. The distance is thus preferably greater than or equal to $\lambda/(2\cdot NA)$, where $\lambda$ is the wavelength of the detected radiation and NA is the numerical aperture of the imaging optical unit 12. In the exemplary embodiment described here, the distance is 300 nm.

The recorded image or the corresponding image data are forwarded from the CCD camera 11 to the control unit 6, which evaluates the image data as follows.

Firstly, the control unit 6 determines the respective actual position for each of the measurement marks 13 and derives therefrom the lateral deviation (position error of the detected measurement mark, relative to a freely selectable reference point lying e.g. in the recorded image. In FIG. 5, the position errors of all the detected measurement marks 13 are illustrated as a vector field, the maximum deviation being 85.9 nm. In the illustration in FIG. 5, grid lines are depicted for clarification purposes, the respective actual position (relative to the chosen reference point) of the corresponding measurement mark 13 respectively lying at the points of intersection of said grid lines. As can be gathered from the illustration in FIG. 5, no stitching error or relative local position error of the individual sections A11 . . . A33 whatsoever can be inferred from the local position errors of the measurement marks. This is principally owing to the fact that, on account of the imaging aberrations of the imaging optical unit 12 and the detection by means of the CCD camera 11, by far the predominant proportion of the detected position errors result from these aberrations during imaging and are not part of the local position error to be measured.

In order that this proportion of the measured position errors caused by the imaging optical unit 12 and the CCD camera 11 may be reduced to the greatest possible extent, the control unit 6 carries out a high-pass filtering of the vector field since the position error components caused by the imaging optical unit 12 and the CCD camera 11 in the recorded image vary more slowly than the position errors of the measurement marks 13 at the section boundaries on account of the relative local position errors of the individual sections A11-A33 that were generated during the section-by-section exposure. Assuming that the mask writer operates optimally apart from the positioning for the exposure of the individual sections, only abrupt changes at the section boundaries should occur.

The vector field that has been high-pass-filtered in this way is illustrated in FIG. 6, here the maximum vector length being 5.1 nm and thus being smaller approximately by one order of magnitude than in comparison with the maximum vector length in FIG. 5.

It is possible to record images of adjacent regions B of a more comprehensive region which overlap in the edge region of the individual regions B. The high-pass-filtered vector fields obtained by evaluation of these images can then be combined to form a more comprehensive vector field of the more comprehensive region. In the case of the array of 12*12 measurement marks mentioned, the overlap of the regions can be chosen for example such that two rows of a region overlap at measurement marks with two rows of the adjoining region.

The individual sections per se and their position errors can clearly be gathered from FIG. 6 since abrupt changes in the vectors are always present at the section boundaries. The smaller the distance between the measurement marks 13, the better the jumps at the section boundaries can be seen. In FIG. 6, the position of the section A22 which is present on account of the relative local position error is depicted by a dotted line. The illustrated offset of the section A22 is not true to scale but rather illustrated as distinctly excessively large in order to be able to illustrate the relative local position error of the section A22 in FIG. 6. The relative local position error can be calculated for example by forming an average value over all high-pass-filtered position errors of the measurement marks within a section.

It goes without saying that the steps described above need not be carried out in the control unit 6, but rather can also be carried out in part or completely in an external computing unit (not shown in the figures).

The high-pass filtering described can be realized e.g. by formulating a slowly variable vector function $\vec{f}(x, y; a_1, a_2, a_3, \ldots)$ and then determining the coefficients $\{a_1, a_2, a_3 \ldots\}$ by fitting the vector function for all measurement point coordinates $(x_k, y_k)$ where $k=1 \ldots K$ (here K=144), to the measured offset vectors $$\begin{pmatrix} X_k \\ Y_k \end{pmatrix}$$

as optimally as possible. This can be carried out for example by means of the least squares method such that the absolute value of M in formula 1 below becomes minimal $$M = \sum_{k=1}^{K} \left\| \begin{pmatrix} X_k \\ Y_k \end{pmatrix} - \vec{f}(x_k, y_k; a_1, a_2, a_3, \ldots) \right\|^2. \quad (1)$$

The corrected offset vectors can be determined in accordance with formula 2 below $$\begin{pmatrix} X_k^{(corrected)} \\ Y_k^{(corrected)} \end{pmatrix} = \begin{pmatrix} X_k \\ Y_k \end{pmatrix} - \vec{f}(x_k, y_k; a_1, a_2, a_3, \ldots). \quad (2)$$

The corrected offset vectors are illustrated in FIG. 6.

The slowly variable vector function $\vec{f}$ can read as follows, for example:

$$\vec{f}(x_k, y_k; a_1, a_2, a_3, \ldots) = \begin{pmatrix} a_1 \\ a_2 \end{pmatrix} + a_3 \cdot \begin{pmatrix} -y \\ x \end{pmatrix} + \quad (3)$$

$$a_4 \cdot \begin{pmatrix} x \\ y \end{pmatrix} + a_5 \cdot \begin{pmatrix} y \\ x \end{pmatrix} + a_6 \cdot \begin{pmatrix} x \\ -y \end{pmatrix} + + (a_7 \cdot x + a_8 \cdot y) \cdot \begin{pmatrix} x \\ y \end{pmatrix} +$$

$$(a_9 \cdot y + \cdot a_{10} \cdot x) \cdot \begin{pmatrix} -y \\ x \end{pmatrix} + + a_{11} \cdot (x^2 + y^2) \cdot \begin{pmatrix} x \\ y \end{pmatrix} +$$

$$a_{12} \cdot (x^2 + y^2)^2 \cdot \begin{pmatrix} x \\ y \end{pmatrix}.$$

A slowly variable vector function $\vec{f}$ is understood here to mean, in particular, such a function which changes more slowly over each of the adjoining sections A11-A33 (or the function values of which change more slowly) than the expected abrupt changes in the position errors of the measurement marks 13 at the section boundaries of the mutually adjoining sections A11-A33.

The individual terms specified in formula 3 can, but need not, all be contained in the slowly variable vector function $\vec{f}$.

The term $$\begin{pmatrix} a_1 \\ a_2 \end{pmatrix}$$

concerns translations, the term $$a_3 \cdot \begin{pmatrix} -y \\ x \end{pmatrix}$$

concerns rotations, the term $$a_4 \cdot \begin{pmatrix} x \\ y \end{pmatrix}$$

concerns the magnifications, the term $$a_5 \cdot \begin{pmatrix} y \\ x \end{pmatrix}$$

concerns non-orthogonal changes, the term $$a_6 \cdot \begin{pmatrix} x \\ -y \end{pmatrix}$$

concerns asymmetrical scales in the x- and y-direction, the term $$(a_7 \cdot x + a_8 \cdot y) \cdot \begin{pmatrix} x \\ y \end{pmatrix}$$

concerns trapezoidal errors, the term $$(a_9 \cdot y + \cdot a_{10} \cdot x) \cdot \begin{pmatrix} -y \\ x \end{pmatrix}$$

concerns wedge errors, and the terms $$a_{11} \cdot (x^2 + y^2) \cdot \begin{pmatrix} x \\ y \end{pmatrix} \text{ and } a_{12} \cdot (x^2 + y^2)^2 \cdot \begin{pmatrix} x \\ y \end{pmatrix}$$

concern third-and respectively fifth-order rotationally symmetrical distortions.

The device 1 according to the invention for measuring the relative local position error thus makes it possible for the systematic components of the measured position error which are caused by the imaging optical unit 12 and the CCD camera 11 to be eliminated to the greatest possible extent, such that the local position error of the at least one section A22 can be determined with a single recording of the region B. It is not necessary for the object 2 to be positioned highly accurately by means of the object stage 5. Of course, with the device 1 according to the invention it is possible to carry out a plurality of recordings of the same region B. Moreover, the object 2 can be displaced by means of the object stage 5 in order to create a plurality of recordings successively of different locations of the object and thus to determine the relative local position errors from a plurality of sections. This information can then be used to increase the accuracy of the pattern writer by which the object 2 was exposed.

The measurement marks 13 can be special measurement marks which are usually provided in the case of masks for registration. It is also possible, of course, to use other structures of the mask 2 from which the position over the mask 2 is known.

Of course, it is also possible to choose the region B that is recorded in magnified fashion by means of detection module 4 such that a plurality of sections of the lithography mask 2 that is exposed section by section are completely recorded. This is illustrated schematically in FIG. 7 in the same way as in FIG. 2. A comparison between FIGS. 2 and 7 reveals that with ideal exposure six sections A23, A24, A32, A34, A42 and A43 lie completely in the recording region B.

In FIG. 8, the local offset is illustrated for each of the sections in a greatly exaggerated manner in the same way as in FIG. 3. It can be seen from the illustration in FIG. 8 that the six sections A23, A24, A32, A34, A42 and A43 all lie within the recording region B and the relative local position error can thus be determined according to the invention for each of the six sections. In this case, it is possible to determine the relative local position error for each of the six sections relative to the freely selectable reference point and thus relative to the same reference point. Of course, it is also possible to determine the relative local position error for each of the sections relative to a direct neighbor. In any event an evaluatable statement about the stitching errors produced by the pattern writer is obtained, and this can then be used to improve the accuracy of the pattern writer.

The lithography mask 2 can be e.g. a lithography mask that is only exposed for the qualification of the mask writer. In this case, the measurement marks can be chosen and arranged such that a best possible statement about the stitching errors of the mask writer is obtained. Of course, it is also possible for a lithography mask produced for production to be measured in the manner described.

The invention claimed is:

1. A method for measuring the relative local position error of one of the sections of an object that is exposed section by section, in particular of a lithography mask or of a wafer, each exposed section having a plurality of measurement marks, wherein a) a region of the object which is larger than the one section is imaged in magnified fashion and is detected as an image;

b) position errors of the measurement marks contained in the detected image are determined on the basis of the detected image;

c) corrected position errors are derived by position error components which are caused by the magnified imaging and detection being extracted from the determined position errors of the measurement marks; and d) the relative local position error of the one section is derived on the basis of the corrected position errors of the measurement marks;

wherein, in step c), a high-pass filtering is carried out for deriving the corrected position errors, and a function which changes more slowly than the expected changes in the determined position errors of the measurement marks at the section boundaries is fitted to the position errors determined and then, for each position error determined, the function value of the fitted function for the corresponding measurement mark is subtracted in order to obtain the corrected position error.

2. The method as claimed in claim 1, wherein in step d), the measurement marks which lie in one section are determined on the basis of the corrected position errors of the measurement marks, and the corrected position errors of the measurement marks thus determined are used for deriving the relative local position error of the one section.

3. The method as claimed in claim 2, wherein, in step d), an average value of the corrected position errors of the measurement marks which lie in the corresponding section is formed and used for deriving the relative local position error.

4. The method as claimed in claim 2, wherein, in step a), a region of the object which completely contains a plurality of sections is imaged in magnified fashion and is detected as an image, and, in step d), the relative local position error is derived for each of the plurality of sections from step a).

5. The method as claimed in claim 1, wherein, in step d), an average value of the corrected position errors of the measurement marks which lie in the corresponding section is formed and used for deriving the relative local position error.

6. The method as claimed in claim 1, wherein, in step c), a function which changes more slowly than the expected changes in the determined position errors of the measurement marks at the section boundaries is fitted to the position errors determined and then, for each position error determined, the function value of the fitted function for the corresponding measurement mark is subtracted in order to obtain the corrected position error.

7. The method as claimed in claim 1, wherein, in step a), a region of the object which completely contains a plurality of sections is imaged in magnified fashion and is detected as an image, and, in step d), the relative local position error is derived for each of the plurality of sections from step a).

8. A device for measuring the relative local position error of one of the sections of an object that is exposed section by section, in particular of a lithography mask or of a wafer, each exposed section having a plurality of measurement marks, comprising:
   a recording module, which images a region of the object that is larger than the one section in magnified fashion and detects it as an image; and
   an evaluation module, which
   A) determines position errors of the measurement marks contained in the detected image on the basis of the detected image,
   B) derives corrected position errors by position error components which are caused by the magnified imaging and detection being extracted from the determined position errors of the measurement marks, and
   C) derives the relative local position error of the one section on the basis of the corrected position errors of the measurement marks;
   wherein, in step B), the evaluation module carries out a high-pass filtering for deriving the corrected position errors, and the evaluation module fits a function which changes more slowly than the expected changes in the determined position errors of the measurement marks at the section boundaries to the position errors determined and then, for each position error determined, subtracts the function value of the fitted function for the corresponding measurement mark in order to obtain the corrected position error.

9. The device as claimed in claim 8, wherein, in step C), the evaluation module determines the measurement marks which lie in one section on the basis of the corrected position errors of the measurement marks, and uses the corrected position errors of the measurement marks thus determined for deriving the relative local position error of the one section.

10. The device as claimed in claim 9, wherein, in step C), the evaluation module forms an average value of the corrected position errors of the measurement marks which lie in the corresponding section and uses it for deriving the relative local position error.

11. The device as claimed in claim 9, wherein the recording module images a region of the object which completely contains a plurality of sections in magnified fashion and detects it as an image, and in step C) the evaluation module derives the relative local position error for each of the plurality of sections of the region.

12. The device as claimed in claim 8, wherein, in step C), the evaluation module forms an average value of the corrected position errors of the measurement marks which lie in the corresponding section and uses it for deriving the relative local position error.

13. The device as claimed in claim 8, wherein, in step B) the evaluation module fits a function which changes more slowly than the expected changes in the determined position errors of the measurement marks at the section boundaries to the position errors determined and then, for each position error determined, subtracts the function value of the fitted function for the corresponding measurement mark in order to obtain the corrected position error.

14. The device as claimed in claim 8, wherein the recording module images a region of the object which completely contains a plurality of sections in magnified fashion and detects it as an image, and in step C) the evaluation module derives the relative local position error for each of the plurality of sections of the region.

15. A method for measuring a relative local position error of an exposed section of an object, the method comprising:
   generating, using an imaging tool, an image of a region of an object that is exposed section by section, the region being larger than one of the sections, each exposed section having measurement marks, in which the object is moved to different positions relative to an exposure tool to expose different sections of the object;
   determining position errors of the measurement marks contained in the image of the region of the object;
   determining corrected position errors of the measurement marks to compensate for errors caused by the imaging tool; and
   determining a local position error of the section relative to another section based on the corrected position errors of the measurement marks, the local position error containing information about an error in positioning the object when moving the object from one position to another position to expose different sections of the object.

16. The method of claim 15 in which determining corrected position errors comprises performing a high-pass filtering for determining the corrected position errors.

17. The method of claim 15 in which the measurement marks that are in the section are determined based on the corrected position errors of the measurement marks, and the corrected position errors of the measurement marks thus determined are used for determining the local position error of the section.

18. The method of claim 15 in which an average value of the corrected position errors of the measurement marks that are in the section is used for determining the local position error.

19. The method of claim 15 in which a function that changes more slowly than expected changes in the determined position errors of the measurement marks at section boundaries is fitted to the position errors determined, and for each position error determined, the function value of the fitted function for the corresponding measurement mark is subtracted in order to obtain the corrected position error.

20. The method of claim 15 in which the region of the object completely contains two or more sections, and the method comprises determining a relative local position error for each of the sections contained in the region.

21. An apparatus for measuring a relative local position error of an exposed section of an object, the apparatus comprising:
    a recording module configured to generate an image of a region of an object that is exposed section by section, the region being larger than one of the sections, each exposed section having measurement marks, in which the object is moved to different positions relative to an exposure tool to expose different sections of the object; and
    an evaluation module configured to:
        determine position errors of the measurement marks contained in the image of the region of the object;
        determine corrected position errors of the measurement marks to compensate for errors caused by the imaging tool; and
        determine a local position error of the section relative to another section based on the corrected position errors of the measurement marks, the local position error containing information about an error in positioning the object when moving the object from one position to another position to expose different sections of the object.

22. The apparatus of claim 21 in which the evaluation module is configured to derive corrected position errors by performing a high-pass filtering for determining the corrected position errors.

23. The apparatus of claim 21 in which the evaluation module is configured to determine the measurement marks that lie in the section based on the corrected position errors of the measurement marks, and use the corrected position errors of the measurement marks thus determined to determine the relative local position error of the section.

24. The apparatus of claim 21 in which the evaluation module is configured to form an average value of the corrected position errors of the measurement marks that are in the section and use the average value to determine the relative local position error.

25. The apparatus of claim 21 in which the evaluation module is configured to fit a function that changes more slowly than expected changes in the determined position errors of the measurement marks at section boundaries to the position errors determined, and for each position error determined, subtract the function value of the fitted function for the corresponding measurement mark in order to obtain the corrected position error.

26. The apparatus of claim 21 in which the recording module is configured to generate an image of a region of the object that completely contains two or more sections, and the evaluation module is configured to determine the relative local position error for each of the sections in the region.

* * * * *

UNITED STATES PATENT AND TRADEMARK OFFICE
CERTIFICATE OF CORRECTION

PATENT NO. : 8,731,273 B2
APPLICATION NO. : 13/130600
DATED : May 20, 2014
INVENTOR(S) : Michael Arnz et al.

It is certified that error appears in the above-identified patent and that said Letters Patent is hereby corrected as shown below:

On the Title Page

Column 1, insert Item -- (30) Foreign Application Priority Data
        Dec. 3, 2008   (DE) ....10 2008 060 293.0 --

In the Specification

Column 2

Line 47, delete "section" and insert -- section. --

Column 3

Line 23, delete "possible" and insert -- possible. --

Column 6

Line 50-59, delete

"$$\vec{f}(x_k, y_k; a_1, a_2, a_3, \ldots) = \begin{pmatrix} a_1 \\ a_2 \end{pmatrix} + a_3 \cdot \begin{pmatrix} -y \\ x \end{pmatrix} + a_4 \cdot \begin{pmatrix} x \\ y \end{pmatrix} + a_5 \cdot \begin{pmatrix} y \\ x \end{pmatrix} + a_6 \cdot \begin{pmatrix} x \\ -y \end{pmatrix} + +$$

$$(a_7 \cdot x + a_8 \cdot y) \cdot \begin{pmatrix} x \\ y \end{pmatrix} + (a_9 \cdot y + a_{10} \cdot x) \cdot \begin{pmatrix} -y \\ x \end{pmatrix} + +$$

$$a_{11} \cdot (x^2 + y^2) \cdot \begin{pmatrix} x \\ y \end{pmatrix} + a_{12} \cdot (x^2 + y^2)^2 \cdot \begin{pmatrix} x \\ y \end{pmatrix}$$"

Signed and Sealed this
Second Day of September, 2014

Michelle K. Lee
*Deputy Director of the United States Patent and Trademark Office*

CERTIFICATE OF CORRECTION (continued)
U.S. Pat. No. 8,731,273 B2 and insert $$\vec{f}(x,y;a_1,a_{2,}a_{3,}...) = \begin{pmatrix} a_1 \\ a_2 \end{pmatrix} + a_3 \cdot \begin{pmatrix} -y \\ x \end{pmatrix} + a_4 \cdot \begin{pmatrix} x \\ y \end{pmatrix} + a_5 \cdot \begin{pmatrix} y \\ x \end{pmatrix} + a_6 \cdot \begin{pmatrix} x \\ -y \end{pmatrix} +$$

$$(a_7 \cdot x + a_8 \cdot y) \cdot \begin{pmatrix} x \\ y \end{pmatrix} + (a_9 \cdot y + a_{10} \cdot x) \cdot \begin{pmatrix} -y \\ x \end{pmatrix} +$$

$$a_{11} \cdot (x^2 + y^2) \cdot \begin{pmatrix} x \\ y \end{pmatrix} + a_{12} \cdot (x^2 + y^2)^2 \cdot \begin{pmatrix} x \\ y \end{pmatrix}$$

-- --